(12) United States Patent
Yang

(10) Patent No.: US 6,427,219 B1
(45) Date of Patent: *Jul. 30, 2002

(54) METHOD AND APPARATUS FOR DETECTING AND CORRECTING ERRORS USING CYCLIC REDUNDANCY CHECK

(75) Inventor: Ganning Yang, Irvine, CA (US)

(73) Assignee: Conexant Systems, Inc., Newport Beach, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/103,421

(22) Filed: Jun. 24, 1998

(51) Int. Cl.$^7$ ................................................ H03M 13/00
(52) U.S. Cl. ....................................... 714/758; 714/800
(58) Field of Search .................................. 714/775, 779, 714/758, 785, 762, 755, 746, 752, 712, 776, 800; 360/53; 370/216

(56) References Cited

U.S. PATENT DOCUMENTS

| | | | |
|---|---|---|---|
| 5,084,891 A | * | 1/1992 | Ariyavisitakul et al. ..... 714/775 |
| 5,539,755 A | * | 7/1996 | Baggen ........................ 714/779 |
| 5,606,569 A | * | 2/1997 | MacDonald et al. ........ 714/758 |
| 5,610,929 A | * | 3/1997 | Yamamoto ................... 714/785 |
| 5,657,331 A | * | 8/1997 | Metzner et al. ............. 714/762 |
| 5,710,756 A | * | 1/1998 | Pasternak et al. ........... 370/216 |
| 5,925,146 A | * | 7/1999 | Murata et al. ............... 714/746 |
| 5,996,105 A | * | 11/1999 | Zook ........................... 714/755 |
| 6,043,946 A | * | 3/2000 | Genheimer et al. .......... 360/53 |
| 6,049,903 A | * | 4/2000 | Nishimura ................... 714/752 |

OTHER PUBLICATIONS

Error Control Coding: Fundamentals and Applications by Shu Lin and Daniel J. Costello, Jr.; Cyclic Codes; ©1983 by Prentice–Hall, Inc., Englewood Cliffs, NJ 07632; pp. 85–122.

Mobile Communications Engineering by William C. Y. Lee; Signal–Error Analysis Versus System Performance; 2nd Edition; ©1982 by McGraw–Hill Companies, Inc.; pp. 456–458.

* cited by examiner

*Primary Examiner*—David Ton
(74) *Attorney, Agent, or Firm*—Knobbe, Martens, Olson and Bear LLP

(57) ABSTRACT

The present invention relates to a method and apparatus that uses cyclic redundancy check (CRC) bits to detect errors and correct particular four-bit error patterns in an information burst. The present invention is particularly suited for relatively simple systems that use differential encoding and either differential or coherent demodulation with no error correction capabilities, such as the Personal Handy Phone System (PHS), DECT, PACS and some digital cordless phones systems. The apparatus also adjusts its error-correction capability to accommodate different types of information bursts and channel qualities. The present invention may be used in a number of wireless, digital communication systems.

38 Claims, 14 Drawing Sheets

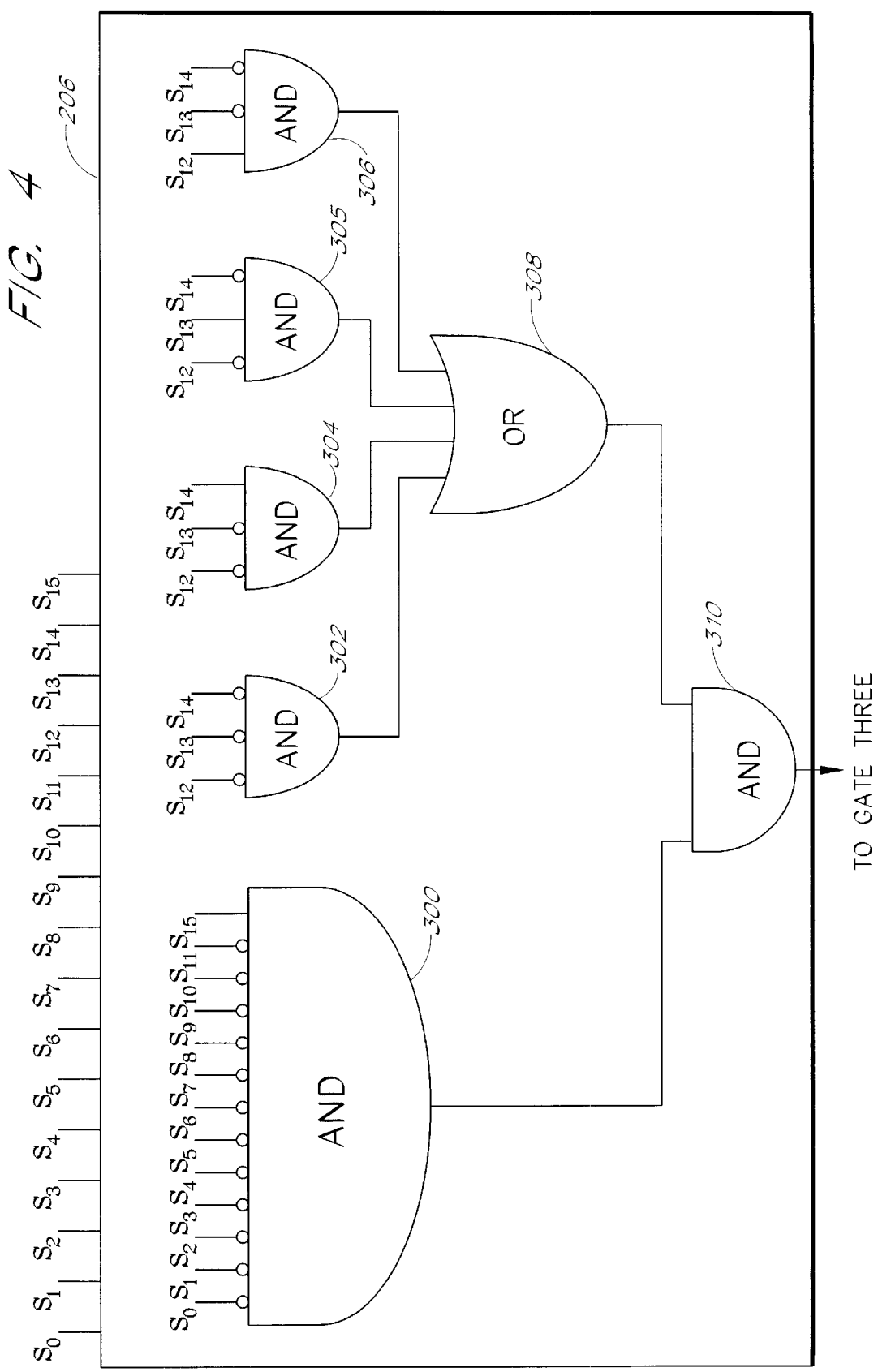

FIG. 9A
| $X_R$ | $Y_R$ | $\triangle \theta$ |
|---|---|---|
| 1 | 1 | $-3\pi/4$ |
| 0 | 1 | $3\pi/4$ |
| 0 | 0 | $\pi/4$ |
| 1 | 0 | $-\pi/4$ |
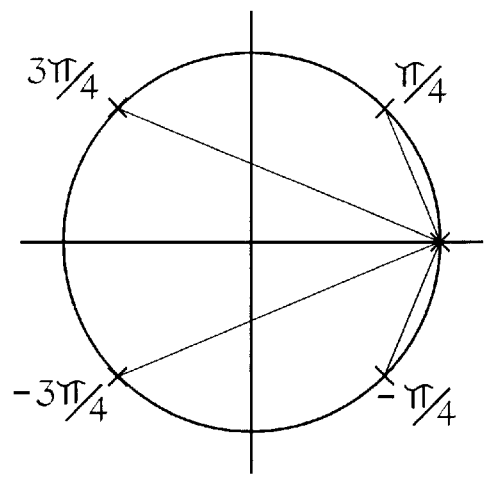
FIG. 9B
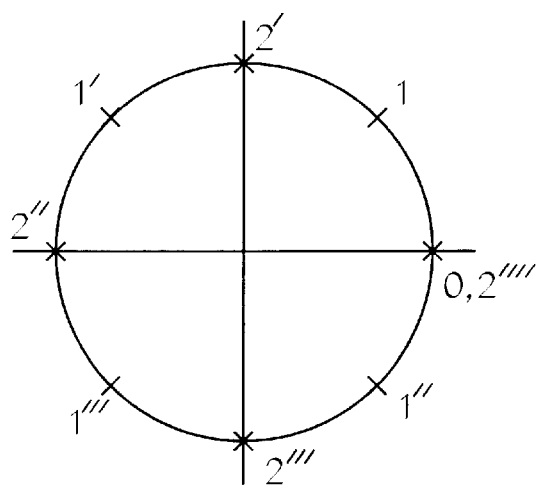
FIG. 9C

| 3 DECODED ABSOLUTE PHASES | | | CORRESPONDING PHASE CHANGES | | CORRESPONDING DECODED BITS | ERROR PATTERN |
|---|---|---|---|---|---|---|
| 0 | 1 | 2' | $\pi/4$ | $\pi/4$ | 00 00 | — |
| 0 | 1' | 2' | $3\pi/4$ | $-\pi/4$ | 01 10 | 0XX0 |
| 0 | 1'' | 2' | $-\pi/4$ | $3\pi/4$ | 10 01 | X00X |
| 0 | 1 | 2'' | $\pi/4$ | $3\pi/4$ | 00 01 | — |
| 0 | 1' | 2'' | $3\pi/4$ | $\pi/4$ | 01 00 | 0X0X |
| 0 | 1'' | 2'' | $-\pi/4$ | $-3\pi/4$ | 10 11 | X0X0 |
| 0 | 1 | 2''' | $\pi/4$ | $-3\pi/4$ | 00 11 | — |
| 0 | 1' | 2''' | $3\pi/4$ | $3\pi/4$ | 01 01 | 0XX0 |
| 0 | 1'' | 2''' | $-\pi/4$ | $-\pi/4$ | 10 10 | X00X |
| 0 | 1 | 2'''' | $\pi/4$ | $-\pi/4$ | 00 10 | — |
| 0 | 1' | 2'''' | $3\pi/4$ | $-3\pi/4$ | 01 11 | 0X0X |
| 0 | 1'' | 2'''' | $-\pi/4$ | $\pi/4$ | 10 11 | X0X0 |

FIG. 9D

| 3 DECODED ABSOLUTE PHASES | | | CORRESPONDING PHASE CHANGES | | CORRESPONDING DECODED BITS | ERROR PATTERN |
|---|---|---|---|---|---|---|
| 0 | 1 | 2 | $3\pi/4$ | $-3\pi/4$ | 01 11 | — |
| 0 | 1' | 2 | $-3\pi/4$ | $3\pi/4$ | 11 01 | XOXO |
| 0 | 1" | 2 | $\pi/4$ | $-\pi/4$ | 00 10 | OXOX |
| 0 | 1 | 2' | $3\pi/4$ | $-\pi/4$ | 01 10 | — |
| 0 | 1' | 2' | $-3\pi/4$ | $-3\pi/4$ | 11 11 | XOOX |
| 0 | 1" | 2' | $\pi/4$ | $\pi/4$ | 00 00 | OXXO |
| 0 | 1 | 2" | $3\pi/4$ | $\pi/4$ | 01 00 | — |
| 0 | 1' | 2" | $-3\pi/4$ | $-\pi/4$ | 11 10 | XOXO |
| 0 | 1" | 2" | $\pi/4$ | $3\pi/4$ | 00 01 | OXOX |
| 0 | 1 | 2''' | $3\pi/4$ | $3\pi/4$ | 01 01 | — |
| 0 | 1' | 2''' | $-3\pi/4$ | $\pi/4$ | 11 00 | XOOX |
| 0 | 1" | 2''' | $\pi/4$ | $-3\pi/4$ | 00 11 | OXXO |

| 3 DECODED ABSOLUTE PHASES | | | CORRESPONDING PHASE CHANGES | | CORRESPONDING DECODED BITS | ERROR PATTERN |
|---|---|---|---|---|---|---|
| 0 | 1 | 2 | $-3\pi/4$ | $3\pi/4$ | 11 01 | — |
| 0 | 1' | 2 | $-\pi/4$ | $\pi/4$ | 10 00 | 0X0X |
| 0 | 1" | 2 | $3\pi/4$ | $-3\pi/4$ | 01 11 | X0X0 |
| 0 | 1 | 2' | $-3\pi/4$ | $-3\pi/4$ | 11 11 | — |
| 0 | 1' | 2' | $-\pi/4$ | $3\pi/4$ | 10 01 | 0XX0 |
| 0 | 1" | 2' | $3\pi/4$ | $-\pi/4$ | 01 10 | X00X |
| 0 | 1 | 2" | $-3\pi/4$ | $-\pi/4$ | 11 10 | — |
| 0 | 1' | 2" | $-\pi/4$ | $-3\pi/4$ | 10 11 | 0X0X |
| 0 | 1" | 2" | $3\pi/4$ | $\pi/4$ | 01 00 | X0X0 |
| 0 | 1 | 2''' | $-3\pi/4$ | $\pi/4$ | 11 00 | — |
| 0 | 1' | 2''' | $-\pi/4$ | $-\pi/4$ | 10 10 | 0XX0 |
| 0 | 1" | 2''' | $3\pi/4$ | $3\pi/4$ | 01 01 | X00X |

| 3 DECODED ABSOLUTE PHASES | | | CORRESPONDING PHASE CHANGES | | CORRESPONDING DECODED BITS | ERROR PATTERN |
|---|---|---|---|---|---|---|
| 0 | 1 | 2 | $-\pi/4$ | $\pi/4$ | 10 00 | — |
| 0 | 1' | 2 | $\pi/4$ | $-\pi/4$ | 00 10 | X0X0 |
| 0 | 1'' | 2 | $-3\pi/4$ | $3\pi/4$ | 11 01 | 0X0X |
| 0 | 1 | 2' | $-\pi/4$ | $3\pi/4$ | 10 01 | — |
| 0 | 1' | 2' | $\pi/4$ | $\pi/4$ | 00 00 | X00X |
| 0 | 1'' | 2' | $-3\pi/4$ | $-3\pi/4$ | 11 11 | 0XX0 |
| 0 | 1 | 2'' | $-\pi/4$ | $-3\pi/4$ | 10 11 | — |
| 0 | 1' | 2'' | $\pi/4$ | $3\pi/4$ | 00 01 | X0X0 |
| 0 | 1'' | 2'' | $-3\pi/4$ | $-\pi/4$ | 11 10 | 0X0X |
| 0 | 1 | 2''' | $-\pi/4$ | $-\pi/4$ | 10 10 | — |
| 0 | 1' | 2''' | $\pi/4$ | $-3\pi/4$ | 00 11 | X00X |
| 0 | 1'' | 2''' | $-3\pi/4$ | $\pi/4$ | 11 00 | 0XX0 |

METHOD AND APPARATUS FOR DETECTING AND CORRECTING ERRORS USING CYCLIC REDUNDANCY CHECK

BACKGROUND OF THE INVENTION

1. Field of the Invention

The present invention relates generally to wireless communication devices. Specifically, the present invention relates to the detection and correction of errors in received signals.

2. Brief Description of the Related Art

In block coding for wireless digital communications, a transmitter transmits information bits with parity check bits added to the end of the information bits. Information bits may include control information (including initialization, synchronization, etc.), data, or voice message. The information bits and parity check bits together make up a code word or vector. At the receiving end, a receiver decodes the received code words and uses the parity check bits to detect errors in the received code word. Cyclic coding is one form of block coding. Shortened cyclic coding is an abbreviated form of cyclic coding. See *Error Control Coding* by Shu Lin et al, Prentice-Hall, Inc., 1983, page 116. Cyclic Redundancy Check (CRC) is one type of shortened cyclic coding.

Any decoder that tries to detect errors has a probability of misdetecting errors. As seen by the receiver, 'misdetection' includes at least two situations. If a frame contains an error and the decoder fails to detect this error (i.e. lets the frame pass for further processing as error-free), then there is a misdetection. If the decoder detects an error and miscorrects the error, then this is also a misdetection because the decoder 'thinks' it made a proper correction. Any decoder that attempts to correct errors increases the probability of misdetecting frame errors. This can degrade system performance.

SUMMARY OF THE INVENTION

The present invention relates to a method and apparatus for detecting and correcting errors using CRC. The present invention is preferably used in communication systems that have error detection but no error correction capabilities. For example, the Personal Handy Phone System (PHS), a Japanese communication standard, has error detection but no error correction capability. See *Personal Handy Phone System ARIB Standard*, Version 2, RCR STD-28 by Association of Radio Industries and Businesses. Other relatively simple systems that have no error correction capability include the Digital European Cordless Telephone (DECT) system, Personal Access Communication System (PACS) (a United States standard) and some digital cordless phones. The present invention is suited for a system that uses a one-bit-to-one-symbol modulation, such as Differential Binary Phase Shift Keying (DBPSK), or a two-bit-to-one-symbol modulation, such as Differential Quadrature Phase Shift Keying (DQPSK) or π/4 Differential QPSK (π/4 DQPSK)), with either differential or coherent demodulation.

Currently, CRC is used to detect random or burst errors in DBPSK, DQPSK and π/4 DQPSK communication systems with either differential or coherent demodulation. CRC possesses a high degree of error detection capability compared to other forms of coding. In relatively simple systems like PHS, if the decoder detects an error, the decoder erases the information burst (e.g. for speech bits) or requests the transmitter to retransmit the same burst (e.g. for data bits). According to open literature, conventional CRC with a minimum distance of four can be used to correct a single-bit or a double-adjacent-bit error pattern in a single data frame. But if there are more errors than a single-bit or a double-adjacent-bit error pattern in a single frame, then CRC does not guarantee successful error correction. Once CRC is used to correct single-bit and double-adjacent bit errors, CRC quickly loses its high error detection capability. Current, practical communication systems do not use CRC to correct errors because correcting a single-bit or a double-adjacent-bit error pattern in a control or data frame does not justify the increased probability of misdetection associated with error correction. In other words, it is dangerous to sacrifice CRC's high error detection capability, particularly for control bursts, to correct limited error patterns. Control bursts require perfect or near-perfect transmission. As a result, where error correction is needed, a more sophisticated error correction system is often used, such as Reed-Soloman and convolutional coding. One problem with this type of error correction is that it is incompatible with the simpler system referenced above and it would add to the cost of the equipment.

Another reason why practical communication systems do not use CRC to correct errors is that error correction becomes counterproductive when the channel is noisy, which causes multiple transmission errors in each frame or burst of information. Error correction using CRC in this case would increase the probability of creating more errors. Current industry standards and systems teach away from using CRC for error correction. *Mobile Communications Engineering* by William C. Y. Lee, 2d ed, McGraw-Hill Companies, Inc., 1998, page 457 ("The cyclic redundancy check is used to detect the error only").

The present invention recognizes that any modulation system that converts two bits to one symbol using differential encoding will cause double-adjacent symbol errors when each symbol is converted to two bits at the demodulation (decoding) end. The present invention further recognizes that these double-adjacent symbol errors correspond to a limited number of four-bit error patterns, and that these four-bit error patterns can be corrected. The present invention uses CRC to correct these four-bit error patterns without adding significant hardware and software. This is particularly advantageous in systems that have little or no error correction capabilities.

By using CRC to correct errors, the present invention increases throughput (amount of information bits received and actually used) compared to current systems because the decoder in the present invention does not simply erase entire information bursts or requests the transmitter to retransmit the information bursts. The decoder in the present invention corrects errors in information bursts using CRC. For example, if 10 information bursts are sent in a system with no error correction and 3 out of 10 information bursts contain errors, then those 3 information bursts must be erased or retransmitted. Erasing information bits decreases throughput and degrades performance. Retransmission takes additional time, which also degrades performance. But 2 out of 3 of the information bursts with errors may contain error patterns which are correctable by the present invention. Thus, the present invention increases throughput without adding more redundant check bits to the information burst or adding significantly more circuitry to the decoder.

In addition, the present invention recognizes that different types of information bursts (data, voice or control) in different channel conditions need different degrees of error detection capability. For example, high error detection is required for all control bursts. Because of the importance of a control burst, it has a very low tolerance for errors. Using CRC to correct errors may create additional errors if the channel quality is particularly poor. Thus, the use of CRC to correct errors should be done only when the signal is of a very high quality. In contrast, routine data bursts, representing voice data for example, can tolerate some additional errors which a decoder might make if it uses CRC to correct errors where the signal quality is somewhat lower. In one preferred embodiment of the present invention, error correction is turned on for voice bursts and is turned off for control bursts.

Similarly, the present invention recognizes that when the channel quality is poor (noisy channels), error correction is likely to create more errors and misdetections, and thus deteriorate performance. But when channel quality is relatively good, error correction using CRC can significantly improve performance in systems that have little or no error correction capability.

The present invention recognizes that a decoder may turn error correction using CRC on and off depending on the type of burst and channel quality. This makes the present invention more efficient when compared to current systems using a standard length CRC solely for error detection for both data and control bursts. For example, for a system that uses a standard 16-bit CRC, the present invention uses all 16 bits for both error detection and error correction. The amount of error correction varies, depending on the channel quality and the type of burst. In contrast, other systems use the same standard 16-bit CRC only for error detection, regardless of channel quality and type of burst. The present invention makes better use of the information provided by CRC and accomplishes much more with the same number of CRC bits, which in this example is 16.

The present invention recognizes that the accuracy of channel quality estimation is important to apply CRC for error correction. The present invention uses a composite channel quality estimation which combines different channel quality estimates from various estimating methods.

The present invention corrects random errors due to non-perfect timing effects in fading channels and resolves the error floor issue due to non-perfect radio frequency (RF) circuits. The present invention also minimizes the processing delay due to error corrections, minimizes the amount of added hardware needed to detect and correct errors without losing any bandwidth efficiency, and controls the misdetection probability of frame errors.

Differential coding, cyclic codes and CRC are explained in further detail in *Digital Communications* by John G. Prokais, 3d ed, McGraw-Hill Companies, Inc., 1995, *Error Control Coding* by Shu Lin et al, Prentice-Hall, Inc., 1983, and *Mobile Communications Engineering* by William C. Y. Lee, 2d ed, McGraw-Hill Companies, Inc., 1998, respectively, which are hereby incorporated herein by reference.

BRIEF DESCRIPTION OF THE DRAWINGS

FIG. 4 is an exemplary logic circuit for the error pattern detection circuit of FIG. 3.

FIG. 9A illustrates the differential coding regulations for a $\pi/4$ DQPSK system such as PHS.

FIG. 9B illustrates a signal space diagram which shows the location of the four decoded absolute phases for a $\pi/4$ DQPSK system.

FIG. 9C is a signal space diagram.

FIG. 9D illustrates examples of three consecutive decoded absolute phases according to FIG. 9A in a noise-free channel, their possible variations in a noisy channel, and their corresponding correctable error patterns.

DETAILED DESCRIPTION OF THE PREFERRED EMBODIMENT

Figure 1:
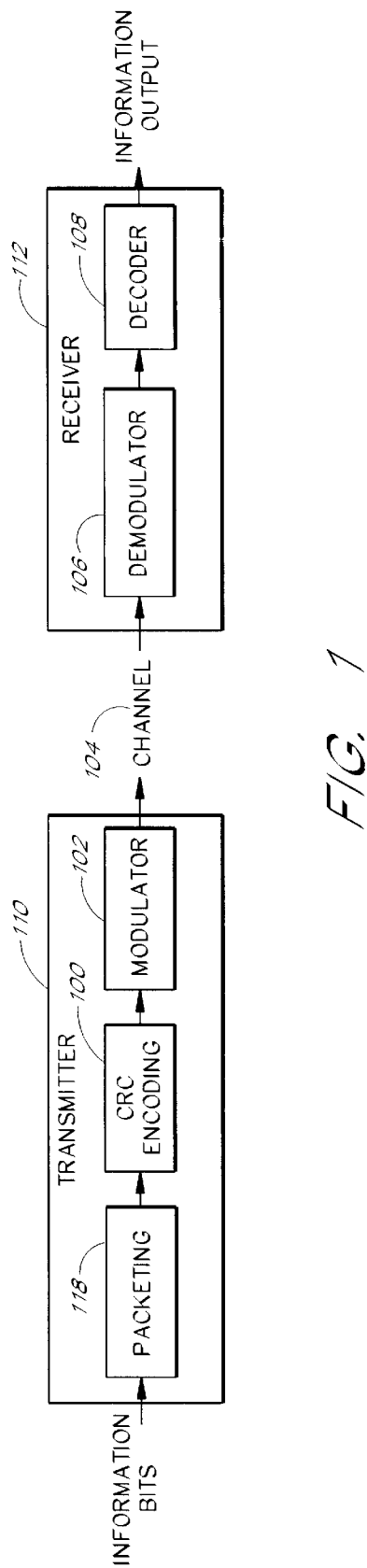
FIG. 1 illustrates a transmitter and receiver in accordance with a preferred embodiment of the present invention.

FIG. 1 illustrates a method of packeting, coding, modulation, demodulation and decoding in accordance with the present invention. In general, a transmitter 110 encodes information and sends it across a communication channel 104 to a receiver 112. The receiver 112 decodes the information for reception.

Specifically, the transmitter 110 first uses a packeting module 118 to packet control, voice and data bits into an information burst. The transmitter 110 then uses a cyclic redundancy check (CRC) encoder 100 to encode the information bits into a code word (also called a code vector or burst or frame) by generating check bits and adding these bits to the end of the information bits. A modulator 102 converts the digital binary bits of the code word to symbols (analog waveforms that match the characteristics of the channel) which differ in amplitude, phase, frequency or some combination. In modulation systems such as DQPSK and $\pi/4$ DQPSK, two binary bits correspond to one symbol. See *Digital Communications* by John G. Prokais, 1995 and *Personal Handy Phone System ARIB Standard*, Version 2, pages 29–30, by the Association of Radio Industries and Businesses. The transmitter 110 sends this coded, modulated signal to a receiver 112. Within the receiver 112, a demodulator 106 demodulates the signal from symbols to binary data, and a decoder 108 decodes the data.

Figure 2:
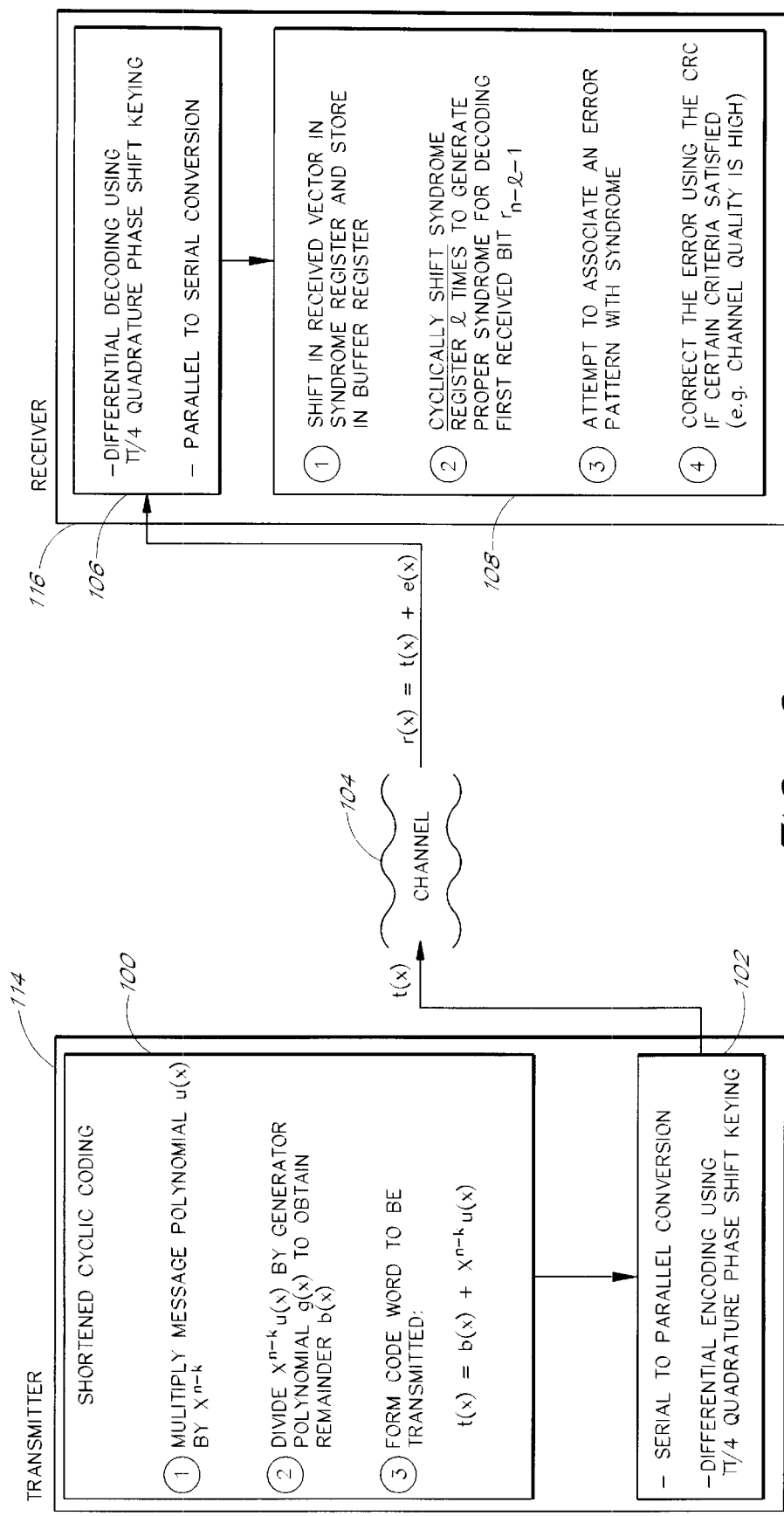
FIG. 2 illustrates the transmitter and receiver of FIG. 1 using an exemplary coding and modulation method.

FIG. 2 illustrates the coding and decoding processes of FIG. 1 in more detail using an exemplary coding and modulation method. In general, a transmitter 114 generates the CRC bits, adds the CRC bits to the end of the control and data bits to form a code word, converts the code word binary bits to symbols using a serial to parallel converter, and differentially encodes the symbols into signals using π/4 QPSK. Specifically, each symbol is associated with a phase. Differential encoding relates to the change in phase between two consecutive symbols. See *Personal Handy Phone System ARIB Standard,* Version 2, pages 29–30, by the Association of Radio Industries and Businesses. For coherent and differential demodulation, if one phase is incorrect because of a transmission error, then there may be two symbol errors.

The transmitter 114 sends the code word across a channel 104 to a receiver 116. For example, the channel 104 may be a fading channel or a channel with additive white Gaussian noise (AWGN). The receiver 116 differentially decodes the code word sent by the transmitter 114, converts the symbols to bits using a parallel to serial converter, and uses the CRC bits to detect and correct errors that occurred during transmission.

When the channel 104 contains noise or interference, the coded, modulated signal contains transmission errors. In coherent demodulation, the demodulator 106 makes a 'phase decision error' when it attempts to determine (guess) what phase is received, i.e. match the received phase with a known phase. In differential demodulation, the demodulator 106 makes a symbol (or difference in phase) decision error when it attempts to determine (guess) what symbol (or difference in phase) is received, i.e. match the received symbol with a known symbol. For example, if the phase received by a decoder 108 in a π/4 DQPSK system using coherent demodulation is π/3, the decoder 108 will assume the true transmitted signal is π/4 because π/4 is the closest to π/3 than the other phases (3π/4, −π/4, −3π/4).

In differential phase shift-keying (DPSK), demodulation of differentially encoded PSK signals does not require estimation of the carrier phase. The received signal is compared to the phase of the received signal from the preceding signalling interval. In other words, symbols are represented as the relative changes in phase rather than an absolute phase.

Because of the nature of differential encoding and decoding, any single demodulation error may cause two adjacent symbol errors. These decision errors are carried over when the demodulator 106 converts the symbols to binary data for the decoder 108. As discussed above, each symbol translates into two information bits. Thus, one phase decision error causes two symbol errors, which in turn causes a four bit error pattern because of the one symbol to two bits ratio.

The amount and quality of error detection and correction depends on the type of CRC used. For example, a standard 16-bit CRC can detect all single and double bit errors and all errors as a result of odd parity in blocks of any practical length. As for error correction, a 16-bit CRC with a minimum distance of 4 can correct 1-bit errors and double-adjacent bit errors.

In reviewing four-bit error patterns for a differential encoding system using π/4 QPSK and coherent demodulation, it was discovered that there are four four-bit error patterns covering most correctable error patterns which can be corrected using CRC.

The four error patterns used in the preferred embodiment of the present invention will now be explained with reference to FIGS. 9A–12B. FIG. 9A illustrates the differential coding regulations for a π/4 DQPSK system such as PHS. See *Personal Handy Phone System ARIB Standard,* Version 2, page 30, Table 3.4, by the Association of Radio Industries and Businesses. The last column in FIG. 9A is the change in phase between consecutive phases for coherent demodulation. For example, for two consecutive bits of 00 to be encoded, the corresponding phase difference is π/4. FIG. 9B is a signal space diagram which shows the location of the four decoded absolute phases for a π/4 DQPSK system. FIG. 9C is a signal space diagram with every π/4 interval arbitrarily labelled 0, 1, 2', 1', 2", 2'", 1", and 2"". For example, a transition from 0 to 1' in FIG. 9C would be a phase change of 3π/4, and the corresponding bits would be 01 according to FIG. 9A.

In FIG. 9D, the first entry (0, 1, 2') is an example of three consecutive decoded absolute phases in a noise-free channel. (0, 1, 2') correspond to the absolute phases 0,π/4, and π/2 in FIG. 9C. The phase difference between each consecutive absolute phase is π/4, and the corresponding bits decoded are 0000 based on the table in FIG. 9A. If the same three demodulated absolute phases in a noisy channel are detected as (0, 1', 2'), then the phase differences between the consecutive absolute phases are 3π/4 and −π/4 (the phase difference from 0 to 1' is −π/4, and the phase difference between 1' and 2' is −π/4). According to FIG. 9A, 3π/4 and −π/4 correspond to a bit pattern of 0110. Thus, the decoder 108 at the receiver 112 assumes that the transmitter 110 sent a bit pattern of 0110 when the actual transmitted bit pattern was 0000. Therefore the bit error pattern is 0XX0 because the two middle bits in 0110 are in error. The X's represent the bits that are in error, and the 0's represent the bits that are not in error. Similarly, if the decoder 108 detects (0, 1", 2'), the corresponding decoded bits are 1001, and the bit error pattern is X00X, as shown in FIG. 9D.

In the present invention, only the last four (rightmost) bits of a 16-bit CRC shift register are used for error correction. The first twelve bits of the shift register are presumed to be zero during error correction. Thus, in the description below, an error pattern of 000X can be expressed as X, 0X, 000X or 000000000000000X for a 16-bit CRC. Similarly, an error pattern of 00XX can expressed as XX, 00XX or 000000000000XX.

Although there is a possibility that the second received absolute phase is 1'" in a detected sequence (0, 1'", 2'), the resulting bit error pattern would be 1111 or XXXX. This error pattern is an unlikely pattern, and wherever it appears, it indicates there are too many errors in one frame to correct. In the present invention, a channel quality indicator (not shown) would report that the frame containing (0, 1'", 2') is an uncorrectable frame and disable the error correction module 206 to correct errors. The decoder 108 would discard the uncorrectable frame or request the transmitter to retransmit.

In FIG. 9D, there are three more examples of three consecutive decoded absolute phases in a noise-free channel, represented as (0, 1, 2"), (0, 1, 2'") and (0, 1, 2""), and their possible variations in a noisy channel. The correctable bit error patterns corresponding to each example are listed in the righthand column. FIGS. 10A, 10B, 11A, 11B, 12A and 12B are similar to FIGS. 9C and 9D. FIGS. 10A, 10B, 11A, 11B, 12A and 12B illustrate more examples of three consecutive decoded absolute phases in a noise-free channel, their possible variations in a noisy channel, and their corresponding correctable error patterns.

Based on FIGS. 9A–12B, it was discovered that there are four four-bit error patterns that cover most correctable error patterns using CRC. As shown in FIGS. 9A–12B, these correctable error patterns are X0X0, 0X0X, 0XX0 and X00X. The present invention further recognized that the error patterns could be 0X or X0 because an error may occur right before the first valid symbol or the last valid symbol in a frame. Using error trap properties of error correction algorithm, the present invention recognized that the error patterns 000X, X0X0, 0X0X, 0XX0 and X00X can be simplified and grouped as 000X, 00XX, 0X0X, and X00X. These last four error patterns make the error pattern detection circuit of the present invention more efficient. Otherwise, the error detection circuit would have to detect and correct all correctable error patterns that are in accordance with the present invention, such as X000, 0X00, 00X0, 000X, XX00, 0XX0, 00XX, X0X0 and 0X0X. One of ordinary skill in the art will appreciate that error patterns of X000, 0X00, 00X0 are simply cyclic shifts of 000X. The first twelve bits of the 16-bit CRC are presumed to be zeroes as well. Similarly, XX00 and 0XX0 are cyclic shifts of 00XX. And X0X0 is a cyclic shift of 0X0X.

Similarly, error patterns of 000X, 00XX, 0X0X, and X00X can be used for a differentially encoded QPSK system. Thus, for a differential encoding system using QPSK or π/4 QPSK and coherent demodulation, the most efficient, correctable four-bit error patterns are 000X, 00XX, 0X0X and X00X. For a differential encoding system using BPSK and coherent demodulation, the most efficient, correctable error patterns are found to be 0X and XX.

In π/4 DQPSK systems with differential demodulation of signals, demodulation is different from coherent demodulation. Focusing on only the demodulated signal phases, the difference between two consecutive signal phases are decoded, rather than the differential decoding of two consecutive decoded phases in coherent demodulation. For differential demodulation, the present invention found the following correctable bit error patterns: X000, 0X00, 00X0, 000X, 0XX0, 0X0X, X0X0, and X00X. For error correction, these error patterns can be grouped as 000X, 00XX, 0X0X, X00X, similar to a coherent demodulation system described above. These four error patterns can be also used for a DQPSK case. For a BPSK system with differential encoded and differential demodulation, the correctable error patterns are found to be 0X and XX.

In summary, the present invention recognized that for a BPSK system with differential encoding and either coherent or differential demodulation, the correctable bit error patterns are 0X and XX. For a QPSK or π/4 QPSK system with differential encoding and either coherent or differential demodulation, the error patterns for correction are 000X, 00XX, 0X0X and X00X.

In a preferred embodiment, an error location module is added to reduce false correction probability and to decide if a particular error pattern needs correction. For example, for a π/4 QPSK system with differential encoding and either coherent or differential demodulation, if a bit error pattern of 00XX comes from one decoded symbol rather than two consecutive symbols, error correction should not be performed. For a π/4 QPSK system with differential encoding and coherent demodulation, if a bit error pattern of 000X does not come from the first or last decoded symbol, error correction should not be performed.

The error detection and correction process will now be described with reference to FIG. 2. In FIG. 2, an encoder 100 in the transmitter 114 generates CRC bits using a generator polynomial, g(x). The encoder 100 then represents the information bits as coefficients of a message polynomial u(x). For example the data bits (1011) would be represented as:

$$u(x) = 1x^0 + 0x^1 + 1x^2 + 1x^3$$
$$= 1 + x^2 + x^3.$$

In accordance with cyclic encoding in systematic form (the rightmost k bits of each code word are unaltered information bits and the leftmost n−k bits are check bits), the encoder 100 then multiplies u(x) by $x^{n-k}$, with 'n' being the total number of bits in a cyclic code, and 'k' being the number of data or control bits. Thus, n−k is equal to the number of parity bits appended to the end of the data bits.

In shortened cyclic codes with 16 CRC bits, n is very large. In one embodiment, for example, $n=2^{15}-1=32,768-1=32,767$. The variable 'L' can be defined such that n−L is the length of an encoded burst. The length of an encoded traffic burst is 196 bits, and n−L=196. The length of an encoded control burst is 124 bits, and n−L=124 for an encoded control burst.

Next, the encoder 100 divides $x^{n-k}(x)$ by a specific generator polynomial g(x), depending on the system specifications. The remainder b(x) of this division represents the check bits which are appended to the end of the information bits. In one form of shortened cyclic coding, as used in the present invention, b(x) represents the cyclic redundancy check (CRC) bits. Thus, from $$x^{n-k}u(x)=a(x)g(x)+b(x)$$

the transmitted code word or vector is $$t(x)=b(x)+x^{n-k}u(x).$$

The transmitter 114 converts the code word bits to symbols using a serial to parallel converter, and differentially encodes the symbols using π/4 QPSK. π/4 QPSK is known in the art and described further in *Mobile Communications Engineering* by William C. Y. Lee, 2d ed, McGraw-Hill Companies, Inc., 1998.

At the receiver 116, a demodulator 106 differentially decodes the code word using π/4 QPSK and converts the symbols to bits using a parallel to serial converter. The decoder 108 generates a 'syndrome' s(x), which is the remainder of the received code word r(x) divided by the same generator polynomial g(x) used by the encoder 100 at the transmitter 114. The syndrome calculated at different shifts of the code word r(x) gives an indication of whether a transmission error occurred and where the error is in the received code word r(x). The decoder 108 cyclically shifts the syndrome 'L' times (due to the shortened cyclic coding) to generate a proper syndrome for decoding the first received bit. The decoder 108 then attempts to associate an error pattern with the syndrome. The decoder 108 of the present invention corrects a detected error using the CRC bits if certain criteria are satisfied, such as channel quality detected to be above a programmable threshold.

The method and apparatus described above may be used in a number of wireless, digital communication systems. The apparatus is particularly suited for a system that uses differential coding and either differential or coherent demodulation with error detection employing CRC. An exemplary use of the error correction system of the present invention is in a Personal Handy Phone System (PHS). The PHS system is a Time Division Duplexing (TDD) system, which uses one frequency for both transmission and reception on a time-sharing basis. See *Personal Handy Phone System ARIB Standard,* Version 2, by the Association of Radio Industries and Businesses. The standard PHS phone system only uses CRC for error detection, but does not perform any error correction. The present invention can be beneficial even on the mobile unit side alone because it can use currently provided CRC codes to add some correction capabilities to the mobile unit for the signal being received.

In the PHS system, there are 220 bits in a standard burst. A standard burst comprises a 2-bit start symbol (SS), a 6-bit or 62-bit preamble (PR), a 16-bit or 32-bit unique word (UW), 108 or 180 data bits (control signals or voice data), and a 16-bit CRC. For a control burst, k−L=108, n−L=108+16=124, and the total number of encoded burst (data plus CRC bits) is 124. For a traffic burst, k−L=180, n−L=180+16=196, and the total number of encoded burst (data plus CRC bits) is 196. Thus, n−k=16. The PHS system uses a series to parallel converter, differential coding with π/4 QPSK and a generator polynomial $g(x)=1+X^5+X^{12}+X^{16}$.

The error correction process of a preferred embodiment in an exemplary differential coding and coherent demodulation system (PHS) will now be described with reference to FIGS. 2 through 4. If the initial values of the syndrome shift register in the encoder 100 are all set to 0, then the CRC bits b(x) is obtained by multiplying u(x) by $x^{n-k}$ and dividing by g(x):

$$x^{n-k}u(x)=a_0(x)g(x)+b(x).$$

According to the PHS specifications, the initial values of the syndrome shift register in the encoder 100 are all set to 1. Thus, the contents of the initial syndrome register of the encoder 100 can be represented as a polynomial:

$$b'(x)=1+x+x^2+x^3+\ldots+x^{15}.$$

For a shortened cyclic code, such as CRC, the encoder 100 cyclically shifts the contents of the syndrome registers k−L times to calculate a syndrome b"(x) after k−L shifts:

$$x^{k-L}b'(x)=a''(x)g(x)+b''(x).$$

Here, b"(x) represents the contents of the syndrome register before any information bits enter the encoder 100. In cyclic coding, the quotients $a_0(x)$, $a_1(x)$, a"(x), etc. are often of no interest and are discarded by both the encoder and the decoder. The remainders b(x), b"(x), s(x), ρ(x), are the only polynomials used in coding and decoding. In the following equations, the quotients $a_1(x)$, $a_2(x)$, $a_3(x)$, etc. are only used to represent some function of x multiplied by g(x) (i.e. a factor or multiple of g(x)) which are ultimately discarded.

The k−L information bits to be transmitted may be represented by $$u(x)=u_0+u_1x+u_2x^2+\ldots u^{k-L-1}x^{k-L-1}$$

The transmitted code word t(x) is then $$t(x) = b''(x) + b(x) + x^{n-k}u(x)$$
$$= t_0(x) + b''(x)$$

where $t_0(x)=b(x)+x^{n-k}u(x)$, and n−k in the PHS system is 16. The sum b"(x)+b(x) represents the CRC bits transmitted along at the end of the information bits in systematic form $x^{n-k}u(x)$.

If no errors appear, then the received code word r(x) at the receiver 116 is $$r(x) = b''(x) + b(x) + x^{n-k}u(x)$$
$$= r_0(x) + b''(x)$$

where $r_0(x)=b(x)+x^{n-k}u(x)$. For a shortened cyclic code, the decoder 108 must cyclically shift the contents of the shift register 'L' times to generate a proper syndrome $s^{(n-k+L)}(x)$ for decoding the first received bit r(n−L−1). This can be represented as $$x^{n-k+L}r(x)=a_1(x)i\ g(i\ x)+s^{(n-k+L)}(x). \quad (1)$$

The extra 'L' shifts can be eliminated, however, by modifying the connections of the syndrome register to divide $x^{n-k+L}$ by g(x).

$$x^{n-k+L}=a_2(x)g(x)+\rho(x) \quad (2)$$

where ρ(x) is the remainder of $x^{n-k+L}$ divided by g(x). Substituting $a_2(x)g(x)+\rho(x)$ from equation (2) into equation (1) for $x^{n-k+L}$ results in $$[a_2(x)g(x)+\rho(x)]r(x)=a_1(x)g(x)+s^{(n-k+L)}(x).$$

In a binary field with only 1's and 0's, $$a_2(x)r(x)g(x)=-a_2(x)r(x)g(x)$$

and the above equation may be expressed as $$\rho(x)r(x)=[a_1(x)+a_2(x)r(x)]g(x)+s^{(n-k+L)}(x). \quad (3)$$

Thus, the decoder 108 can compute the syndrome $s^{(n-k+L)}(x)$ by multiplying ρ(x) by r(x) and then dividing ρ(x)r(x) by g(x). The quotient $[a_1(x)+a_2(x)r(x)]$ is not useful and is discarded.

For a system such as PHS which sets all initial states of the syndrome register to 1, the left side of equation (3) can also be represented as $$\rho(x)r(x) = \rho(x)[r_0(x) + b''(x)] \quad (4)$$
$$= \rho(x)r_0(x) + \rho(x)b''(x)$$
$$= \rho(x)[b(x) + x^{n-k}u(x)] + \rho(x)b''(x)$$
$$= \rho(x)[b(x) + a_0(x)g(x) + b(x)] + \rho(x)b''(x)$$
$$= \rho(x)a_0(x)g(x) + \rho(x)b''(x)$$
$$= a_3(x)g(x) + \rho(x)b''(x) \quad (5)$$

because a binary field with only 1's and 0's has the following property:

$$b(x)+b(x)=0.$$

Combining equations (3) and (5) results in:

$$a_3(x)g(x)+\rho(x)b\Delta(x)=[a_1(x)+a_2(x)r(x)]g(x)+s^{(n-k+L)}(x).$$

Moving $a_3(x)g(x)$ to the right side yields:

$$\rho(x)b''(x)=[a_1(x)+a_2(x)r(x)+a_3(x)]g(x)+s^{(n-k+L)}(x)$$
$$\rho(x)b''(x)=a_4(x)g(x)+s^{(n-k+L)}(x) \quad (6)$$

where $a_4(x)=a_1(x)+a_2(x)r(x)+a_3(x)$ for simplification. From the definition of b"(x) and equation (2) defining ρ(x), ρ(x)b"(x) may also be expressed as, $$\rho(x)b''(x) = [x^{n-k+L} + a_2(x)g(x)][x^{k-L}b'(x) + a''(x)g(x)] \quad (7)$$
$$= a_5(x)g(x) + [x^{n-k+L}][x^{k-L}b'(x)]$$
$$= a_5(x)g(x) + x^n b'(x).$$

It is known by those of ordinary skill in the art that $g(x)$ is always some factor of $x^n+1$. See *Error Control Coding* by Shu Lin et al, Prentice-Hall, Inc., 1983, p. 89. Thus, $g(x)$ can be expressed as $$g(x)f(x)=x^n+1$$

where $f(x)$ is some factor of $(x^n+1)$. Thus, equation (7) may be expressed as $$\rho(x)b''(x) = a5(x)g(x) + (x^n+1)b'(x) + b'(x). \quad (8)$$
$$= a_5(x)g(x) + a_6(x)g(x)b'(x) + b'(x)$$
$$= a_7(x)g(x) + b'(x).$$

Comparing equations (6) and (8) yields $$\rho(x)b''(x) = a_4(x)g(x) + s^{(n-k+L)}(x)$$
$$= a_7(x)g(x) + b'(x).$$

In an ideal channel with no transmission errors, $$s^{(n-k+L)}(x)=b'(x). \quad (9)$$

Equation (9) suggests that in cases where all initial states are 1's, error detection is to check if all the syndrome registers are all 1's or not. If all the syndrome registers are 1's, then there are no errors. If the syndrome registers are not all 1's, then at least one error is detected.

For an encoder with all initial states of the syndrome register set to 0's:

$$b'(x)=0$$

and equation (9) becomes $$s^{(n-k+L)}(x)=0.$$

This means that if all the syndrome registers are all 0's, then there are no errors. If the syndrome registers are not all 0's, then at least one error is detected. Assuming no errors, $$r(x) = t(x) + e(x) \quad (10)$$
$$= t(x) + 0$$

where $e(x)$ is the error vector.
Thus, $$\rho(x)r(x)=\rho(x)t(x)$$

Substituting $t(x)$ for $r(x)$ in equation (3) yields, $$\rho(x)t(x) = [a_1(x) + a_2(x)r(x)]g(x) + s^{(n-k+L)}(x) \quad (11)$$
$$= a_8(x)g(x) + s^{(n-k+L)}(x)$$
$$= a_8(x)g(x) + 0$$
$$= a_8(x)g(x).$$

As shown in equation (11), $g(x)$ is a factor of $\rho(x)t(x)$.

If there is some error $e(x)$, then the quotient $a1(x)$ in equation (1) is different:

$$x^{n-k+L}r(x)=a_9(x)g(x)+s^{(n-k+L)}(x).$$

Because of the effect of the error $e(x)$ on $r(x)$, the new quotient $a9(x)$ replaces $a1(x)$.

Thus, equation (3) becomes $$\rho(x)r(x)=[a_9(x)+a_2(x)r(x)]g(x)+s^{(n-k+L)}(x). \quad (12)$$

Multiplying every term in equation (10) by $\rho(x)$ yields, $$\rho(x)r(x)=\rho(x)t(x)+\rho(x)e(x)$$

Rearranging the terms of the above equation yields, $$\rho(x)e(x)=\rho(x)r(x)+\rho(x)t(x). \quad (13)$$

substituting equations (3) and (12) into equation (13) yields, $$\rho(x)e(x) = [a_9(x) + a_2(x)r(x)]g(x) + s^{(n-k+L)}(x) + a_8(x)g(x) \quad (14)$$
$$= [a_9(x) + a_2(x)r(x) + a_8(x)]g(x) + s^{(n-k+L)}(x)$$
$$= a_{10}(x)g(x) + s^{(n-k+L)}(x).$$

Equation (14) is the standard form of a shortened cyclic code for an encoder with all initial states of the syndrome register set to 0's. The present invention recognizes and uses standard CRC decoding algorithm to apply equation (14) and the above equations for error correction.

Current systems only use CRC for error detection because correcting a single-bit or a double-adjacent-bit error pattern in a control or data frame does not justify the increased probability of misdetection associated with error correction, as described above. In other words, it is dangerous to sacrifice CRC's high error detection capability, particularly for control bursts, to correct limited error patterns. Control bursts require perfect or near-perfect transmission. Thus, the present invention increases throughput (amount of information bits used) by using CRC for error correction without adding significantly more circuitry. The present invention is particularly suited for relatively simple systems with no other error correction capability, such as PHS (a Japanese standard), DECT (a European standard), PACS (a United States standard), and some digital cordless phones. Currently, these systems only use CRC for error detection. More complex systems use additional hardware and software for error correction methods, such as Reed Soloman.

For a system such as the PHS system with all initial states of the syndrome register set to 1's, the received code word with some error $e(x)$ can be expressed as, $$r(x) = t(x) + e(x) \quad (15)$$
$$= r_0(x) + b''(x) + e(x)$$

From equation (4), $$\rho(x)r(x) = \rho(x)[r_0(x) + b''(x) + e(x)]$$
$$= \rho(x)r_0(x) + \rho(x)b''(x) + \rho(x)e(x).$$

Using equation (5), this can be expressed as, $$\rho(x)r(x) = a_3(x)g(x) + \rho(x)b''(x) + \rho(x)e(x).$$

Substituting equations (8) into the above equation yields, $$\rho(x)r(x) = a_3(x)g(x) +$$
$$a_7(x)g(x) + b$$
$$'(x) + \rho(x)e(x). \quad (16)$$

Rewriting equation (16) and substituting equation (12) yields, $$\rho(x)e(x) = \rho(x)r(x) + a_3(x)g(x) + a_7(x)g(x) + b'(x) \quad (17)$$
$$= [a_9(x) + a_2(x)r(x)]g(x) + a_3(x)g(x) + a_7(x)g(x) +$$
$$s^{(n-k+L)}(x) + b'(x)$$
$$= [a_9(x) + a_2(x)r(x) + a_3(x) + a_7(x)]g(x) +$$
$$s^{(n-k+L)}(x) + b'(x)$$
$$= a_{11}(x)g(x) + s^{(n-k+L)}(x) + b'(x).$$

Let $s_1(n-k+L)$ be defined as $$s_1^{(n-k+L)} = s^{(n-k+L)}(x) + b'(x). \quad (18)$$

Then equation (17) becomes $$\rho(x)e(x) = a_{11}(x)g(x) + s_1^{(n-k+L)}. \quad (19)$$

Equation (19) is in the standard form of a shortened cyclic code as shown by equation (14). Because equation (19) is in the standard form of a shortened cyclic code, the decoder 108 can apply standard decoding algorithm to the new syndrome $s_1^{(n-k+L)}$ to perform error correction.

Figure 3A:
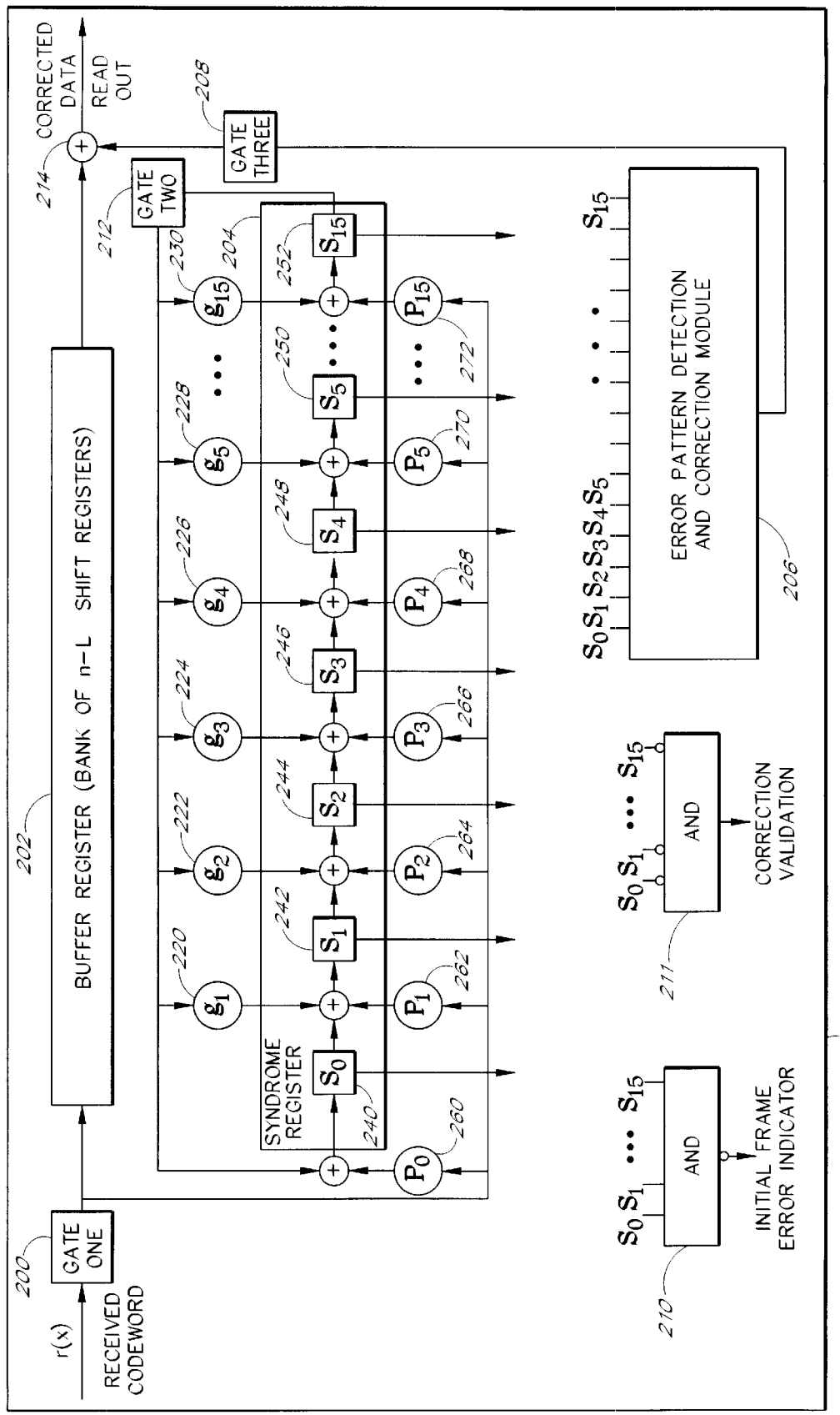
FIG. 3A illustrates an exemplary logic circuit for a decoder contained within the receiver of FIG. 2.

FIG. 3A illustrates a preferred embodiment for the decoder 108 contained within the receiver 116 of FIG. 2 and which implements the above equations. The decoder 108 comprises a Gate One 200, a Gate Two 212, a Gate Three 208, a buffer register 202, gates g1 through g15 220–230, gates p0 through p15 260–272, a syndrome register 204, an initial frame error indicator module 210, a correction validation module 211, an error pattern detection and correction module 206 and an exclusive-OR gate 214. Gate One 200 controls the inflow of bits from the received code word r(x) into the decoder circuit. The received code word r(x) is shifted in from the left end of the circuit one bit at a time and stored in the buffer register 202. In one embodiment, the received code word r(x) is 196 bits in length for control bursts and 124 bits for traffic bursts. The received code word r(x) is also shifted into the syndrome register 204.

The purpose of gates g1 through g15 220–230 and gates p0 through p15 260–272 is to avoid cyclically shifting the syndrome register 204 L times to generate the proper syndrome for decoding shortened cyclic codes. The decoder 108 divides $x^{n-k+L}$ by the generator polynomial g(x) and obtains a remainder $\rho(x)$. Gates p1 through p15 260–272 then multiply the received code word r(x) by $\rho(x)$. Gates g1 through g15 220–230 divide the product of $r(x)\rho(x)$ by the generator polynomial g(x). In a preferred embodiment for a PHS system described above, the values for gates g1 through g15 220–230 are (0,0,0,0,1,0,0,0,0,0,1,0,0,0). The values for gates p0 through p15 260-272 are (0,0,0,1,0,0,0,0,1,1,0, 0,1,0,1,0) for a traffic burst and (1,0,0,1,1,1,0,1,1,1,1,1,1,1, 0,0) for a control burst.

The initial frame error indicator 210 examines the syndrome register 204 to see if the code word contains any errors. The error pattern detection and correction module 206 uses the bits stored in the syndrome register 204 to detect and correct specific errors. FIG. 4 is an exemplary logic circuit for the error pattern detection circuit 206 of FIG. 3A. In FIG. 3A, Gate Three 208 and an exclusive-OR gate 214 correct the errors found by the error pattern detection and correction module 206. The correction validation module 211 indicates whether an uncorrectable error pattern has been detected.

Although the initial frame error indicator circuit 210, the correction validation module 211 and the error pattern detection and correction module 206 in FIGS. 3 and 4 use AND logic gates, those of skill in the art will appreciate that other logic gates may be used to accomplish the same functions. Also, the buffer register 202 may store the code word r(x) in either hardware circuits or software such as random access memory (RAM) with counters. Thus, erroneous bits in the received code word may be corrected all at once, instead of one at a time as performed by the circuit shown in FIG. 3A. Alternatively, a combination of hardware and software may be used to implement the present method and apparatus.

Figure 3B:
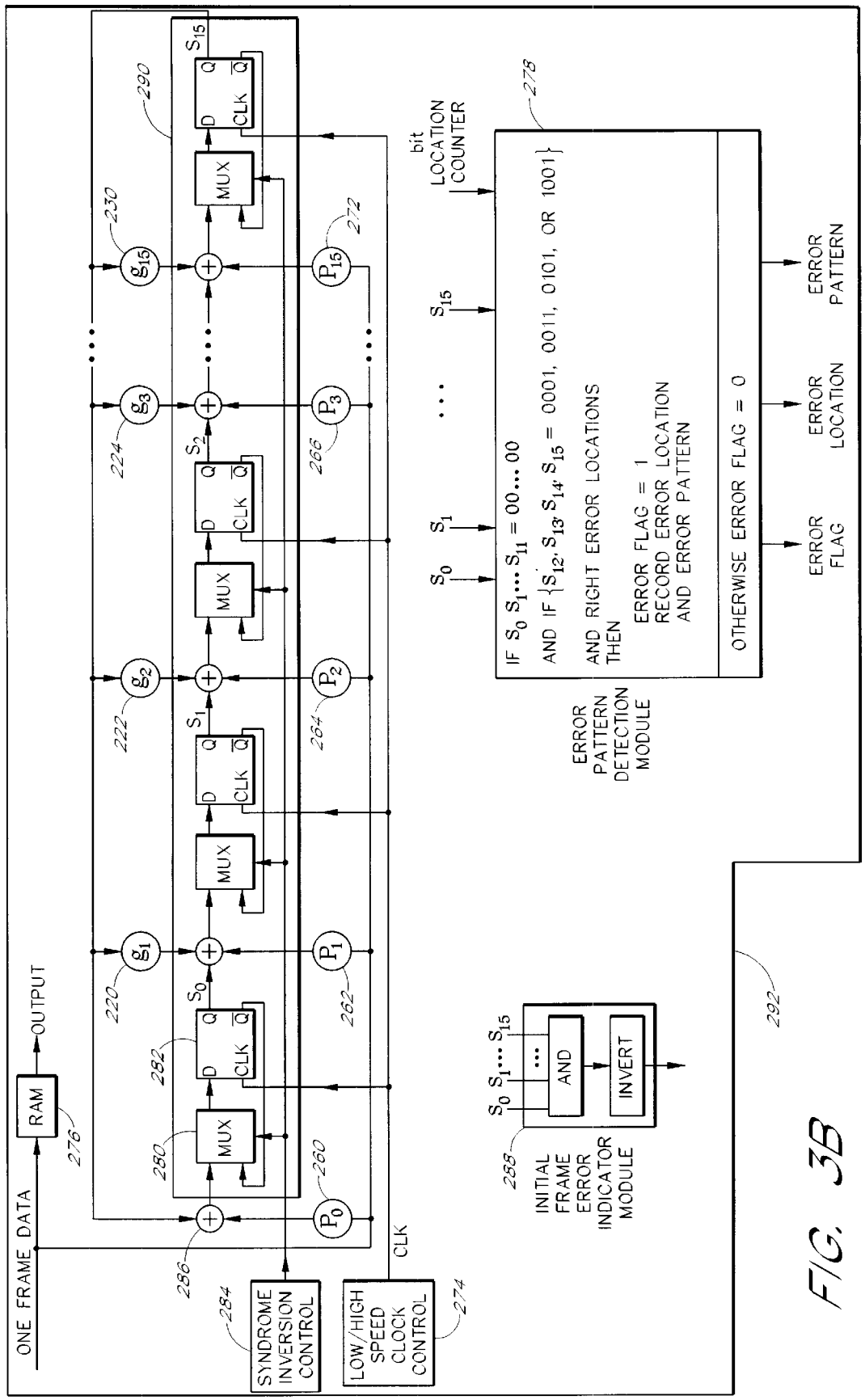
FIG. 3B illustrated a preferred embodiment of the decoder of FIG. 3A.

FIG. 3B illustrates another preferred embodiment of the decoder 108 in FIG. 2 in accordance with the present invention. The operation of the decoder 292 in FIG. 3B is similar to the operation of the decoder 108 in FIG. 3A. The decoder 292 in FIG. 3B includes a RAM 276, a series of gates g1 through g15 220–230, gates p0 through p15 260-272, a syndrome register 290, a syndrome inversion control 284, a low/high speed clock control 274, an initial frame error indicator module 288, and an error pattern detection module 278. The syndrome register 290 comprises a series of multiplexers 280, a series of D latches 282, and a series of exclusive-OR gates 286 (or binary adders).

The use and operation of the decoder 108, 292 illustrated in FIGS. 3A and 3B will now be described in more detail with reference to FIG. 5. In block 502, the decoder 108, 292 resets the error detection and correction module 206 and resets the shift registers $s_0$–$s_{15}$ 240–252 of the syndrome register 204 to zero before receiving a code word r(x). In FIG. 3B, the clock for error detection is set to low speed, which is synchronized with the incoming bit string. The state machine is reset, and bit position counter (not shown) is reset.

In block 504, the decoder 108 in FIG. 3A turns on Gate One 200 and Gate Two 212 and turns Gate Three 208 off. In block 508, the decoder 108, 292 stores the received code word r(x) in the buffer register 202 or RAM 276. To obtain the syndrome in block 506, the decoder 108, 292 shifts the entire received code word r(x), including the received CRC bits at the end of r(x), through the syndrome register 204, 290 and accompanying logic gates, g1–g15 220–230 and p0–p15 260–272 in FIGS. 3A and 3B. 'Shifting' used in relation to the syndrome register 204 includes the calculations (shifting and additions) performed by the adders and logic gates, g1–g15 220–230 and p0–p15 260–272. Each time the syndrome registers 240–252 are cyclically 'shifted,' a new syndrome is calculated by the adders and logic gates, g1–g15 220–230 and p0–p15 260–272. In FIG. 3B, the gates g1 through g15 220–230, gates p0 through p15 260–272, multiplexers 280, D latches 282 and adders 286 perform the substantially same function as described above for FIG. 3A.

To detect errors, the initial frame error indicator module 210, 288 in the decoder 108, 292 check to see if the contents of the syndrome register 204 $s^{(n-k+L)}$ are all 1's after the entire received code word r(x) is shifted into the buffer register. This is shown in block 510. If the syndrome $s^{(n-k+L)}$ in the syndrome register 204 contains all 1's, i.e. $s^{(n-k+L)}$(x)=b'(x)=(1,1,1 . . . 1), then the decoder 108, 292 assumes that no error has occurred and no correction is necessary. This is shown in block 512. If the syndrome register 204 does not contain all 1's, then the received code word r(x) contains some error vector e(x) accumulated during transmission. This is shown in block 514.

In block 516, the decoder 108, 292 checks whether the channel quality is above a certain programmable threshold before it attempts to correct errors in r(x) using CRC. The channel quality threshold for turning on or off error correction depends on how many frames with some undetected errors a particular system can tolerate after error correction, i.e., probability of undetected frame errors after error correction. For voice communications, if the system can tolerate a $10^{-4}$ misdetection probability which corresponds to a bit error rate of $3 \cdot 10^{-3}$, the channel quality threshold may advantageously be selected such that the received SNR is around 7 dB. For a control channel or data channel, the probability of misdetection probability should be less than $10^{-5}$ or even smaller, and the channel quality threshold may advantageously be selected such that the corresponding SNR is around 9 dB or disable error correction.

Figure 7:
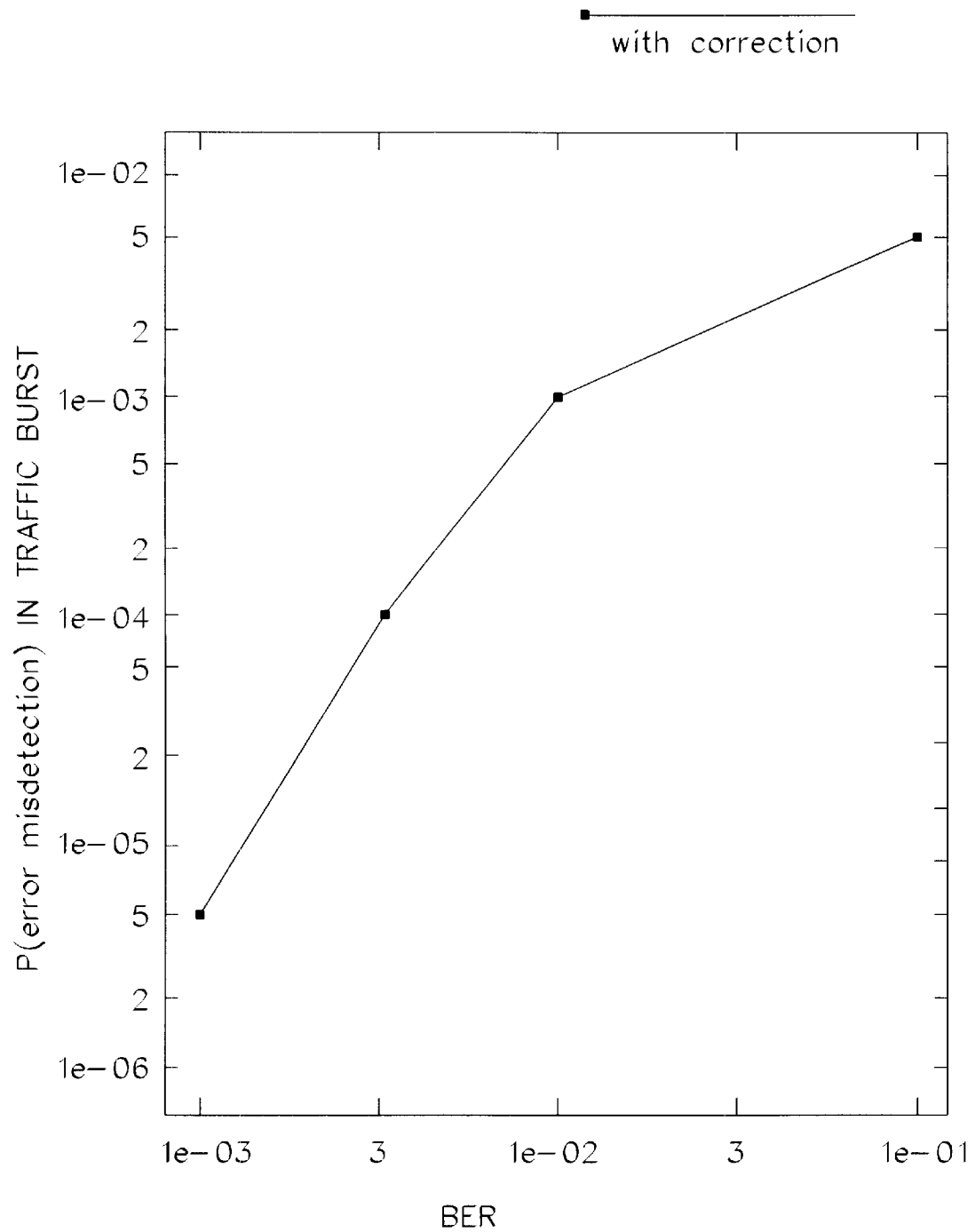
FIG. 7 illustrates the relationship between probability of error misdetection with error correction and bit error rate.

In a preferred embodiment, channel quality is determined immediately after demodulation and simultaneously with error detection. If the channel quality is too poor, i.e. there is a significant amount of noise or interference in the signal which causes multiple transmission errors in a single burst, then error correction is likely to create more errors and misdetections, and thus deteriorate performance. As shown in block 518, if channel quality is too poor, error correction is turned off and the information frame is either discarded or retransmitted. For example, if there are 5 symbol errors in an information burst caused by a particularly noisy channel, then error correction using CRC may generate more errors. This results in a higher false detection probability because the decoder 108 will presume the information burst is 'corrected' when it actually contains errors. Attempted error correction will increase the probability of generating more errors or misdetections. This is shown in FIG. 7.

But when channel quality is relatively good, error correction using CRC can significantly improve performance in relatively systems that have little or no error correction capability. The present invention recognizes that a decoder 108, 292 may turn error correction using CRC on and off depending on the type of burst and channel quality. Thus, the present invention is more efficient when compared to current systems using a standard length CRC solely for error detection for both data and control bursts. Current systems waste bandwidth by transmitting more CRC bits than needed for the particular type of burst and the particular channel quality.

Methods to measure channel quality (or SNR) include (1) received signal strength indicator (RSSI), (2) error metric from phase error, (3) difference in phase measured by an AFC loop or (4) composite symbol detection error residuals measured for the frame or from previous bursts.

In a preferred embodiment, the present invention measures channel quality by using more than one of the channel quality indicators listed above and averaging the estimated SNR generated by each channel quality indicator. This is called a composite channel quality or signal quality. For example, the device may derive the SNR based on the difference in phase of an AFC loop and the SNR based on error metric from phase error. The device then averages the two SNRs to provide a more accurate SNR. If the channel quality indicators are uncorrelated (independent, i.e. measuring and calculating one channel quality indicator does not depend on measurements for another channel quality indicator), then taking the average SNR reduces variance and provides a much more accurate channel quality indication. This makes error correction more efficient because the device will activate error correction at a SNR level where the information bursts do not have multiple errors, and error correction using CRC does not create more errors and misdetections. The present device deactivates error correction using CRC as soon as the SNR drops below this SNR level.

In a preferred embodiment, the channel quality threshold is programmed to be higher for bursts containing control information (e.g. synchronization) than for bursts containing traffic information (voice or data). In another preferred embodiment, instead of a higher threshold, the decoder 108, 292 is programmed to disable its error correction circuit (Gate Three 208) if the received burst contains control information. The reason for this higher threshold is because it is very important to keep a low misdetection probability for control bursts. Unlike data bursts, control bursts require error-free reception because they give instructions to the receiver on how to process the received signals. Because the decoder 108, 292 cannot risk increasing probability of misdetection to correct errors, error correction is disabled.

Figure 8:
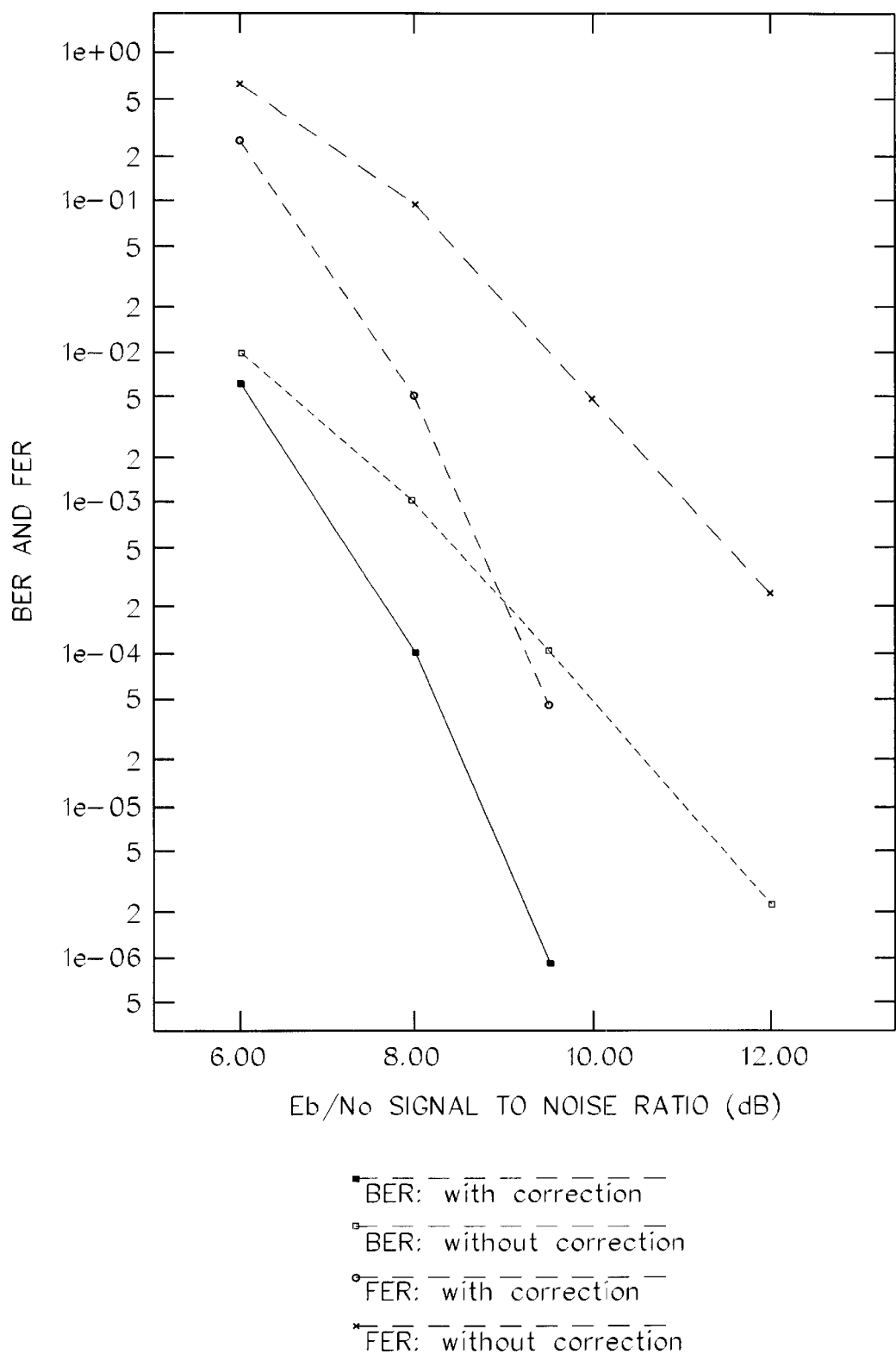
FIG. 8 illustrates the Bit Error Rate and Frame Error Rate versus signal to noise ratio between systems with and without error correction.
Figures 10A, 10B:
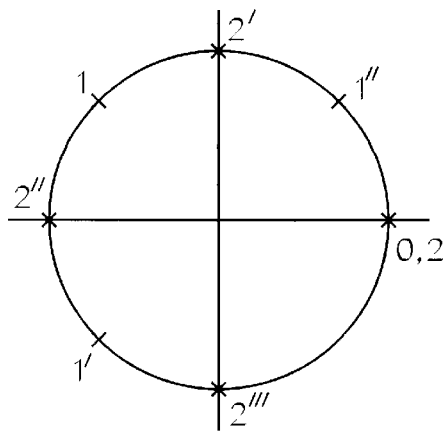
FIG. 10A is another signal space diagram.
FIG. 10B illustrate examples of three consecutive decoded absolute phases according to FIG. 10A in a noise-free channel, their possible variations in a noisy channel, and their corresponding correctable error patterns.
Figures 11A, 11B:
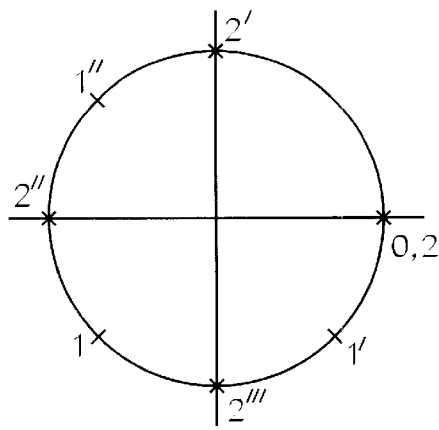
FIG. 11A is another signal space diagram.
FIG. 11B illustrate examples of three consecutive decoded absolute phases according to FIG. 11A in a noise-free channel, their possible variations in a noisy channel, and their corresponding correctable error patterns.
Figures 12A, 12B:
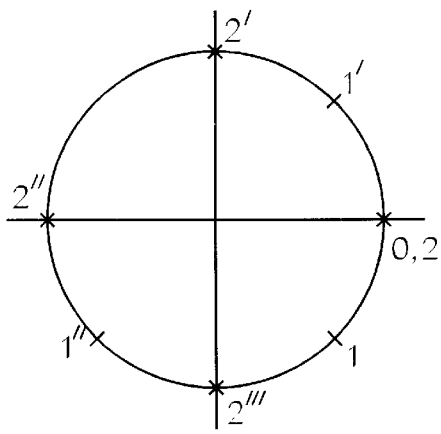
FIG. 12A is another signal space diagram.
FIG. 12B illustrate examples of three consecutive decoded absolute phases according to FIG. 12A in a noise-free channel, their possible variations in a noisy channel, and their corresponding correctable error patterns.

If the decoder 108, 292 determines that the channel quality is above a certain programmed threshold, such as SNR equal to 8.0 dB in FIG. 8, then the decoder 108, 292 performs error correction. In block 520 and FIG. 3A, the decoder 108 turns Gate One 200 off and turns Gate Three 208 on. The decoder 108, 292 inverts the bits currently being stored in the syndrome register 204 using a syndrome inversion module 284 (not shown in FIG. 3A) to form a new syndrome. In FIG. 3B, the syndrome is inverted by sending one pulse on the syndrome inversion control line 284. For example, if the syndrome register contents are 1010111111111111, then the decoder 108, 292 inverts the contents of syndrome register 204 to become 0101000000000000. The decoder 108, 292 uses this new syndrome to correct errors. The decoder 108, 292 also switches the operation clock in FIG. 3B to a higher speed, such as 9.6 MHz.

The decoder 108 then reads the received code word r(x) out of the buffer register 202 bit by bit to pass out of the exclusive-OR gate 214, and cyclically shifts the syndrome register 204 once as each bit of r(x) stored in the buffer register 202 is read out through gate 214.

When the syndrome register 204 matches one of the four error patterns mentioned above (000X, 00XX, 0X0X, X00X), the output of the AND gate 310 in FIG. 4 is 1. The next bit to come out of the buffer register 202 is the erroneous bit. In block 524, the decoder 108, 292 corrects the erroneous bit read out of the buffer register 202 by using an exclusive-OR gate 214 to exclusive-OR the erroneous bit with the 1 output from the AND gate 310.

Those of ordinary skill in the art will appreciate that the error detection module of FIGS. 3A, 3B and 4 may be designed to detect and correct the same error patterns that are in accordance with the present invention but in a different cyclicly shifted form. For example, the error detection and correction module 206 may be designed to detect and correct the following error patterns that are in accordance with the present invention: X000, 0X00, 00X0, XX00, 0XX0 and X0X0.

As shown in block 528, the process in blocks 510 to 524 is repeated until all the bits of the buffer register 202 have been shifted out of the decoder 108, 292. In other words, if the buffer register 202 contains 196 bits, then the syndrome register 204 cyclically shifts 196 times until all 196 bits are read out of the buffer register 202. The contents of the syndrome register 204 change as they are being cyclically shifted. When all the bits have been shifted through, the decoding process ends in block 526.

In FIG. 3B, the syndrome register 290 starts cyclically shifting, and the bit location counter begins incremental counting. As soon as the syndrome in the register 290 is matched to one of the four error patterns, and the error pattern is in a 'right position,' an error flag is set, and the error location and error pattern are recorded. The 'right position' is defined such that the error pattern of X only occurs in the first or last two bit positions, and the error pattern of XX occurs across two consecutive symbols. The syndrome register 290 is cyclically shifted until the bit position counter reaches the end of the frame. If the error flag is set, the error was correctable. If no error flag is set, the error is not correctable. The error is corrected by inverting the erroneous bits in the RAM based on the recorded error location and error pattern.

Figure 5:
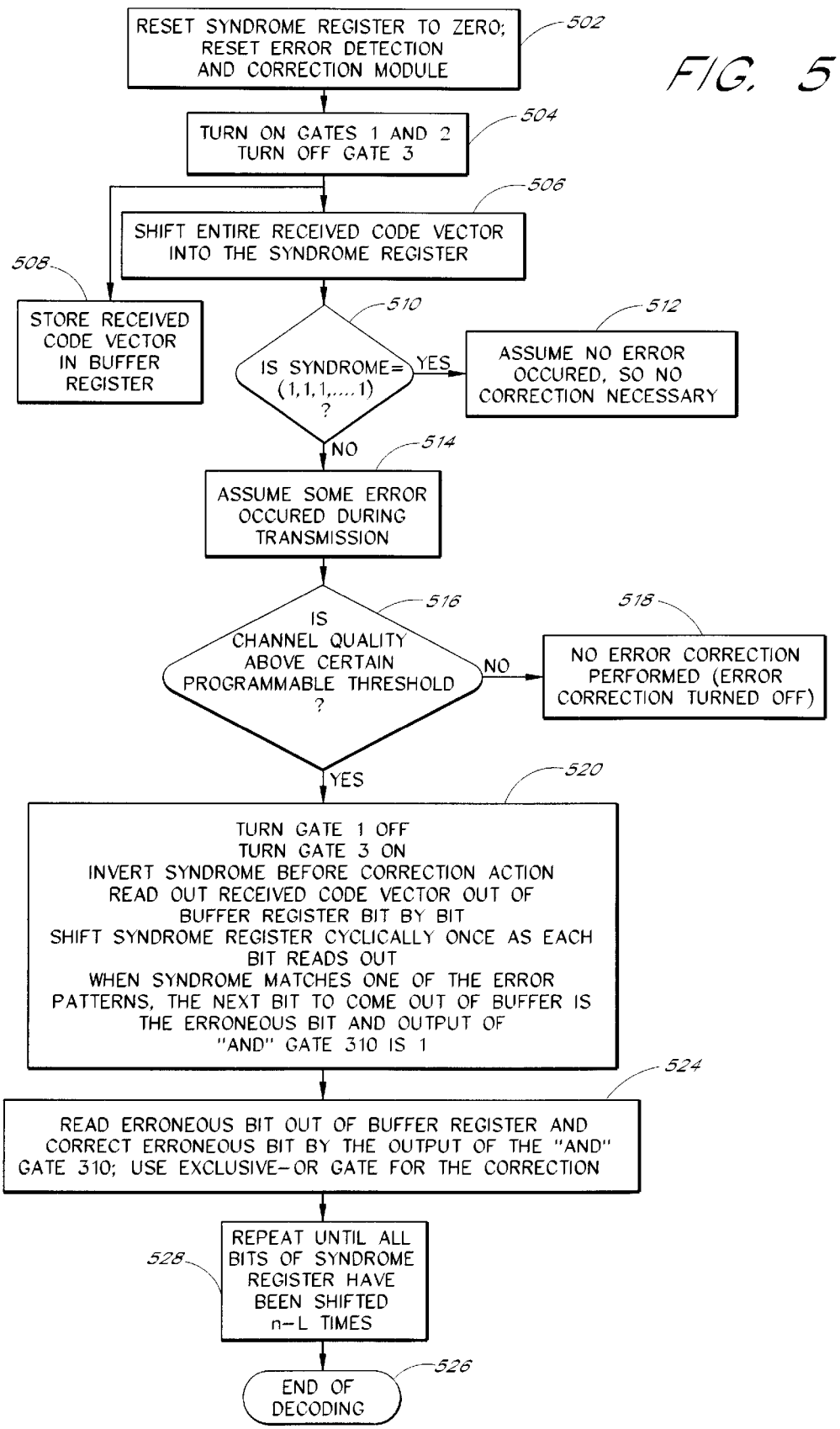
FIG. 5 is a flow chart of the decoding method carried out by the circuit in FIG. 3.
Figure 6:
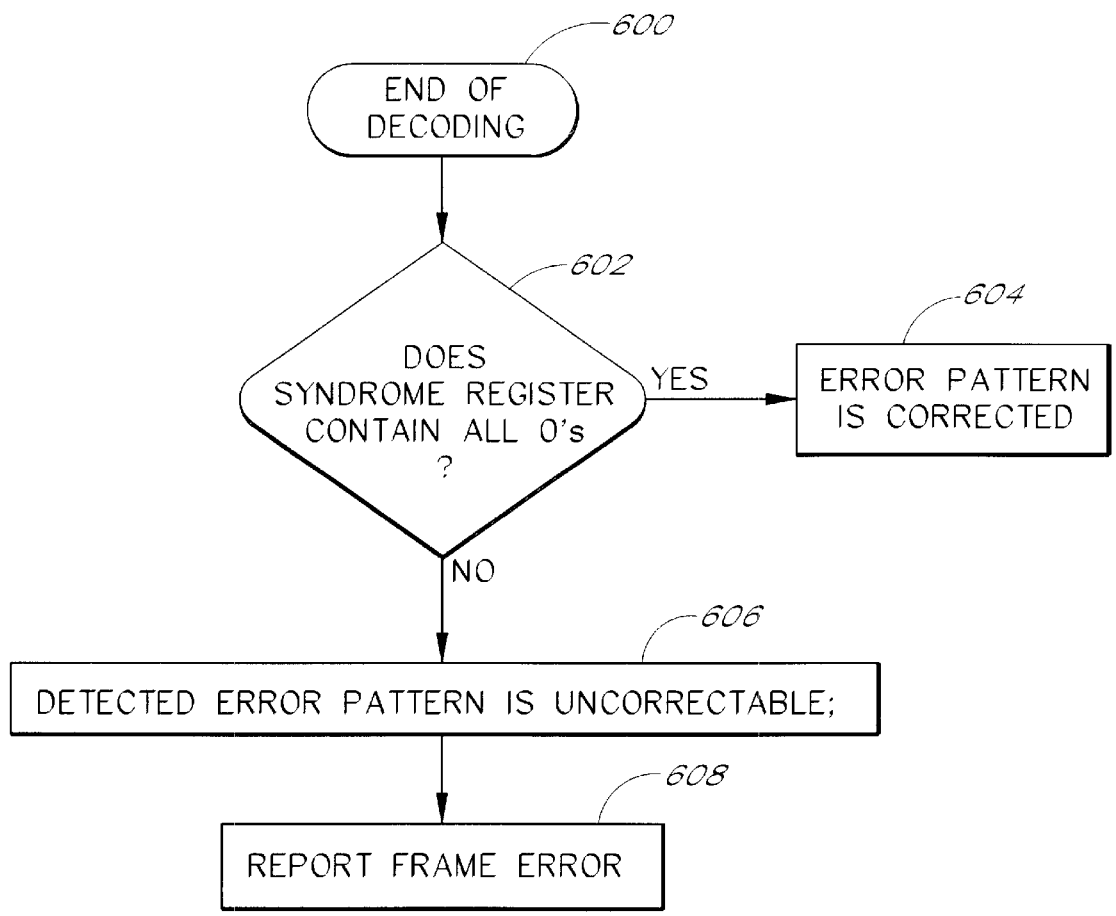
FIG. 6 is a flow chart of a frame error check carried out by the circuit in FIG. 3.

FIG. 6 is a flow chart of a frame correction validation check carried out by the correction validation module 211 in block 602 in FIG. 5. At the end of the decoding process, the correction validation module 211 checks to see if the error was a correctable error. The correction validation module 211 examines the bits of the syndrome register 204 at the end of the decoding operation and indicates whether an uncorrectable error pattern has been detected. In one embodiment, the logic circuit 211 is an AND gate with 16 inverted input bits. Ideally, if the error(s) are all corrected at the end of the decoding process, the syndrome register would contain all 0's. This means that the error(s) was correctable. The inversion of the syndrome register 204 contents would be all 1's, and the output of the AND gate 211 in FIG. 3A would be a 1.

If the frame contains one or more uncorrectable errors, then the contents of the syndrome register 204 would not be all 0's, the inverted contents of the syndrome register 204 would not be all 1's, and the output of the AND gate 211 in FIG. 3A would be a 0, not a 1. An uncorrectable error pattern for the decoder 108, 292 is an error pattern that does not match one of the four four-bit error patterns 000X, 00XX, 0X0X, X00X. For example, a final syndrome of 1010111100101011 would be an uncorrectable error pattern because this syndrome corresponds to a received code word which contains multiple nonadjacent errors.

In block 602, the decoder 108 in FIG. 3A uses a logic circuit 211 to determine if the syndrome register 204 contains all 0's. This is different than block 510 (when the decoder 108 presumes there is error if the syndrome does not contain all 1's) because in block 520 the decoder 108 inverts the syndrome before error correction begins, as described above. Thus, the AND gate of the correction validation module 211 in FIG. 3A inverts the contents of the syndrome register 204 again. The error pattern detection module 276 in FIG. 3B may be structurally different, but performs a similar function as the correction validation module 211 in FIG. 3A.

In blocks 604–608, if the output of the correction validation module 211 is a 0, then the decoder 108 reports to the receiver 116 that there is an uncorrectable frame error. The receiver 116 then discards the frame (if the frame contains voice data) which was read out of gate 214 or requests the transmitter 110 to retransmit the same frame (if the frame contains data bits). As described above, current systems with no error correction capability discard or request retransmission for all frames with detected errors.

FIG. 8 illustrates the signal to noise ratio between systems with and without error correction in AWGN channels. As depicted in FIG. 8, the BER and FER improve significantly if the decoder 108, 292 uses CRC to correct four-bit error patterns.

Thus, the present invention uses CRC to correct random errors due to non-perfect timing effects in fading channels, among other types of errors. The present invention also minimizes the processing delay due to error corrections, minimizes the amount of added hardware needed to detect and correct errors without losing any bandwidth efficiency, and controls the misdetection probability of frame errors.

While embodiments and applications of this invention have been shown and described, it will be apparent to those skilled in the art that various modifications are possible without departing from the scope of the invention. It is, therefore, to be understood that within the scope of the appended claims, this invention may be practiced otherwise than as specifically described.

What is claimed is:

1. An apparatus for detecting and selectively correcting transmission errors using cyclic redundancy check bits in a communication system that has little or no error correction capability and uses differential coding, said apparatus comprising:

a buffer unit for holding the bits of a received code word which comprises of information bits and the cyclic redundancy check bits;

a plurality of gates for deriving a syndrome from the received code word using a generator polynomial associated with said cyclic redundancy check bits;

a syndrome register for holding the derived syndrome and cyclically shifting the derived syndrome one bit as each bit is read out of the buffer unit;

an error detection module for detecting errors in the received code word using the cyclically shifted syndrome;

an error correction module that selectively corrects double-adjacent symbol errors corresponding to a limited number of four-bit error patterns in the cyclically shifted syndrome as part of a decoding process when channel quality is above a programmable threshold; and a correction validation module for examining the syndrome register at the end of the decoding process and indicating whether the received code word contains an uncorrectable error.

2. The apparatus of claim 1 wherein said communication system uses differential demodulation.

3. The apparatus of claim 1 wherein said communication system uses coherent demodulation.

4. The apparatus of claim 1 further comprising a syndrome inversion control module for inverting the contents of the syndrome register before error correction.

5. The apparatus of claim 1 further comprising a clock speed control module for controlling the speed of the syndrome register during error detection and error correction.

6. The apparatus of claim 1 wherein the error correction module determines channel quality by deriving an error metric from phase error.

7. The apparatus of claim 1 wherein the error correction module determines channel quality by deriving the difference in phase measured by an AFC loop.

8. The apparatus of claim 1 wherein the error correction module determines channel quality by deriving a received signal strength indicator.

9. The apparatus of claim 1 wherein the error correction module determines channel quality by deriving a composite symbol detection error residuals measured for each frame.

10. The apparatus of claim 1 wherein the error correction module determines channel quality by deriving and averaging the signal-to-noise ratios based on more than one of the following:
    error metric from phase error;
    difference in phase measured by an AFC loop;
    a received signal strength indicator; and
    a composite symbol detection error residuals measured for each frame.

11. The apparatus of claim 1 wherein the programmable threshold is set according to the tolerance level of misdetection associated with a particular type of information in the received code word.

12. The apparatus of claim 1 wherein the error correction module is deactivated for a control burst.

13. The apparatus of claim 1 wherein the cyclic redundancy check is 16 bits long and the error patterns include:
    000X, where the 0's represent bits that are not in error and the Xs represent the bits that are in error.
    00XX;
    0X0X; and
    X00X.

14. The apparatus of claim 1 wherein the cyclic redundancy check is 16 bits long and the error patterns include:
    X000, where the 0's represent bits that are not in error and the Xs represent the bits that are in error.
    XX00;
    0X0X; and
    X00X.

15. The apparatus of claim 1 wherein the communication system does not use error correction codes (ECC).

16. The apparatus of claim 1 wherein the communication system is a Personal Handy Phone System.

17. The apparatus of claim 1 wherein the communication system is a Digital European Cordless Telephone system.

18. The apparatus of claim 1 wherein the communication system is a Personal Access Communication System.

19. The apparatus of claim 1 wherein the communication system is a digital cordless phone system.

20. The apparatus of claim 1 wherein the differential coding involves Binary Phase Shift Keying.

21. The apparatus of claim 1 wherein the differential coding involves Quadrature Phase Shift Keying.

22. The apparatus of claim 1 wherein the differential coding involves $\pi/4$ Quadrature Phase Shift Keying.

23. The apparatus of claim 1 wherein the buffer unit comprises a hardware circuit.

24. The apparatus of claim 1 wherein the buffer unit comprises an allocated memory space.

25. The apparatus of claim 24 wherein the memory space is a random access memory.

26. The apparatus of claim 25 further comprising an error location module for correcting the bits in the received code word stored in the random access memory.

27. An apparatus for detecting and selectively correcting errors using cyclic redundancy check bits in a communication system that uses differential coding, said apparatus comprising:
    a memory for storing the bits of a received code word;
    a syndrome register for deriving a syndrome from the received code word using a generator polynomial associated with the cyclic redundancy check bits and cyclically shifting the derived syndrome;
    an error detection and correction module to detect errors in the received code word and to selectively correct data values within the detected errors in the received code word using the cyclically shifted syndrome based on type of information in the received code word and when the channel quality is above a programmable threshold; and
    a correction validation module for examining the syndrome register at the end of the decoding process and indicating whether the received code word contains an uncorrectable error.

28. A method of detecting and selectively correcting transmission error patterns using cyclic redundancy check bits in a communication system that uses differential encoding, said method comprising:
    receiving a frame of encoded data from a transmitter across a channel;
    deriving a syndrome for a received code word in the frame using a generator polynomial associated with said cyclic redundancy check bits;
    using the derived syndrome to determine if there are any errors in the information bits of the received code word;
    determining the channel quality;
    performing error correction to correct up to two erroneous data values in the received code word using cyclically shifted versions of said derived syndrome as part of a decoding process when the channel quality is above a programmable threshold and selected bits of the cyclically shifted syndrome correspond to one or more of four predetermined error patterns; and
    examining the syndrome register at the end of the decoding process to indicate whether the received code word contains an uncorrectable error.

29. The method of claim 28 further comprising the act of discarding a frame with an uncorrectable error if the frame contains voice data.

30. The method of claim 28 further comprising the act of requesting the transmitter to retransmit the same frame if the frame contains uncorrectable data bits.

31. The method of claim 28 further comprising the act of storing the received code word in a buffer unit.

32. A communication system comprising:
    a base station for transmitting information bursts over a channel, said base station uses a differential encoding system and adds cyclic redundancy check bits to the information bursts by using a generator polynomial for the purpose of error detection;
    a mobile unit which uses the same generator polynomial used by the base station to detect errors in the transmission of the information bursts and to selectively correct up to two detected errors in each information burst without altering the encoding system used by the base station or adding more components to the base station, said detected errors are selectively corrected using the cyclic redundancy check bits when the detected errors correspond to one or more of two two-bit predefined error patterns and the quality of the channel is above a predetermined threshold.

33. A method of improving the performance of a communication system which uses differential encoding and generates cyclic redundancy check bits using a generator polynomial, said method comprising:

defining a limited number of four-bit correctable error patterns;

measuring channel quality; and performing error correction to correct up to two erroneous data values in encoded information bits using the cyclic redundancy check bits during decoding of the encoded information bits when one or more of the correctable error patterns are detected and the channel quality is above a predetermined threshold.

34. A mobile receiver unit for selective error correction in a wireless communication system, the mobile receiver unit comprising:

an RF receiver to receive signals transmitted from a base station;

a channel quality indicator to provide information on the signal quality of the received signals;

a decoder in communication with said receiver to decode the received signals and provide a series of frames containing data and cyclic redundancy check syndrome bits; and an error detection and selective correction module to selectively correct data values in detected errors in one of the frames using the cyclic redundancy check syndrome bits when the detected errors correspond to one or more predetermined four-bit error patterns and the signal quality is above a programmable threshold.

35. The mobile receiver unit of claim 34 wherein the error detection and correction module includes a threshold monitor to turn error correction off when the mobile receiver unit determines that channel quality is below a certain predetermined threshold.

36. The mobile receiver unit of claim 34 wherein the wireless communication system is a Personal Handy Phone System.

37. The mobile receiver unit of claim 34 wherein the wireless communication system uses a two-bit-to-one-symbol ratio and differential encoding.

38. The mobile receiver unit of claim 37 wherein the wireless communication system uses $\pi/4$ Quadrature Phase Shift Keying.

* * * * *